United States Patent [19]

Gallagher et al.

[11] Patent Number: 4,576,698
[45] Date of Patent: Mar. 18, 1986

[54] PLASMA ETCH CLEANING IN LOW PRESSURE CHEMICAL VAPOR DEPOSITION SYSTEMS

[75] Inventors: James P. Gallagher, Newburgh; Howard W. Schmidt, Jr., Walden, both of N.Y.

[73] Assignee: International Business Machines Corporation, Armonk, N.Y.

[21] Appl. No.: 509,518

[22] Filed: Jun. 30, 1983

[51] Int. Cl.$^4$ ............................................. C23C 14/00
[52] U.S. Cl. ............................... 204/192 E; 134/1; 118/715; 156/643; 204/298
[58] Field of Search .............. 204/192 R, 192 E, 298; 134/1, 22.1; 118/715, 50.1; 427/34, 38, 39, 248.1; 156/643, 345

[56] References Cited

U.S. PATENT DOCUMENTS

| 4,123,316 | 10/1978 | Tsuchimoto | 156/643 |
| 4,123,663 | 10/1978 | Horiike | 250/531 |
| 4,138,306 | 2/1979 | Niwa | 156/345 |
| 4,225,222 | 9/1980 | Kempter | 355/3 DR |
| 4,265,730 | 5/1981 | Hirose et al. | 204/298 |
| 4,461,237 | 7/1984 | Hinkel et al. | 118/50.1 |
| 4,500,563 | 2/1985 | Ellenberger | 428/38 |

Primary Examiner—Andrew H. Metz
Assistant Examiner—William Leader
Attorney, Agent, or Firm—Sughrue, Mion, Zinn, Macpeak, and Seas

[57] ABSTRACT

A system for in situ plasma etch removal of deposition products that accumulate during device processing. An r.f. electrode is configured to removably fit coaxially within the chamber, a quartz tube. A chamber heater shield functions also as an r.f. return. Cleaning gas is introduced into the chamber and r.f. power supplied to the electrodes to initiate an r.f. plasma which etch cleans formations on the quartz tube walls. The deposition equipment is cleaned without the need for disassembly.

6 Claims, 1 Drawing Figure

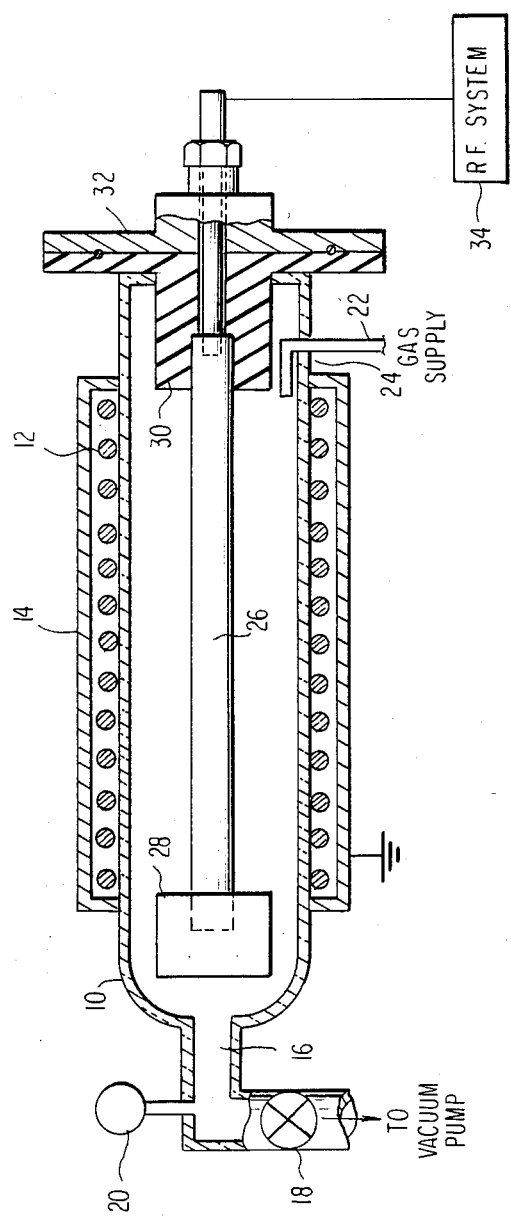

PLASMA ETCH CLEANING IN LOW PRESSURE CHEMICAL VAPOR DEPOSITION SYSTEMS

BACKGROUND OF THE INVENTION

This invention relates to a system for the cleaning of equipment used in the production of semiconductor devices. In particular, this invention relates to an apparatus for the cleaning of low pressure chemical vapor deposition chambers utilizing r.f. techniques.

A known process in the manufacture of semiconductors utilizes low pressure chemical vapor deposition. This technique is used in the formation of layers such as silicon nitride, silicon dioxide and polysilicon on a silicon substrate. Low pressure techniques, that is, in the range of 0.5-3 torr have advantages in terms of uniformity in processing especially for passivation. Typically, the substrate is placed in a reaction chamber which is heated and brought to a low pressure state. A reaction gas is introduced into the chamber such that the reaction material is deposited on the semiconductor substrate either by reaction or thermal decomposition of the reaction gas.

While offering advantages in terms of a system through-put and high product level quality, low pressure chemical vapor deposition results in the buildup of deposition products on the walls of the reaction chamber. The chamber is typically a quartz tube. Unless periodically cleaned, this buildup results in flakes which tend to contaminate the semiconductor products and cause defects in the layers being formed. Consequently, unless the reaction material deposited on the inner walls of the reaction chamber is removed, it may contaminate the substrate during processing so that normal growth and coating cannot occur.

It is therefore necessary to periodically clean the reaction chamber to remove these undesired deposits. Within the technology such contaminants are currently removed by wet etching the quartz tube in a solution of hydrofluoric and nitric acid. This wet etch process requires that the apparatus be completely broken down and the quartz tube removed. Thus, the equipment is unusable for a period of time up to 24 hours.

Other techniques have been proposed such as heating the reaction chamber to a high temperature, for example 1000° C. and then introducing the same type of corrosive gas into the reaction chamber. This technique, however, requires high temperatures and cannot be used on those materials which cannot be subjected to such a temperature regime.

Within the prior art, other techniques are known for the treatment of semiconductors and/or associated reaction equipment. For example, in the case of plasma enhanced C.V.D. systems, etch cleaning of the chambers is accomplished simply by introducing a cleaning gas into the chamber environment. Such a system is shown in U.S. Pat. No. 4,138,306. Cleaning plasma is generated externally and introduced into the reaction chamber 1 by means of a conduit 7. A plasma generating section 9 utilizes microwave energy, oscillator 11 supplied via a wave guide 12 such that the microwaves activate the etching gas which is then introduced into the reaction chamber. Such a system while offering advantages of simplicity in terms of the cleaning steps per se results in a complicated and expensive device. In essence, a dedicated microwave system is required for activating of the cleaning gas.

U.S. Pat. No. 3,924,024 relates to a technique of treating the oxide surface of wafers prior to deposition of silicon nitride. Other patents dealing specifically with the cleaning or etching of wafers utilizing activated gas reaction components are identified in U.S. Pat. Nos. 4,065,369 and 4,278,493. These systems relate to the cleaning or etching of wafers and not to reaction of chambers and deposition C.V.D. equipment itself. Other prior art directed to the cleaning or etching of wafers is shown in U.S. Pat. Nos. 4,088,926 and 4,278,493. These prior art systems relate to the cleaning of wafer surfaces utilizing ion milling and the like. Other patents considered but deemed to be of less interest are U.S. Pat. Nos. 4,058,638 and 4,220,116. These patents deal respectively with techniques for performing multiple semiconductor manufacture operations in a common chamber or to a gas flow structure utilized in low pressure chemical vapor deposition systems to create uniform films. Neither of the patents deal specifically with the concepts or problems of cleaning the system.

SUMMARY OF THE INVENTION

Given the deficiencies in the prior art, it is an object of this invention to define a system which allows for in situ plasma etch removal of deposition products which build up in a deposition chamber.

Yet another object of this invention is to define a system for cleaning low pressure chemical vapor deposition equipment without modifying commercially available devices.

A further object of this invention is to define a system of providing for a cleaning of deposition product residues from the inside of deposition chambers that minimizes equipment down time and cost.

These and other objects of this invention are achieved by the placement of an r.f. electrode in the center of the low pressure chemical vapor deposition system. The tube has disposed co-axially over it a heater having a metal thermal cover. This cover is used as an r.f. return. A field is then set up between the r.f. electrode and the heater shield. The cleaning gas enters the tube either through its own port or through a process gas port. Thus, etched cleaning of the chamber occurs simply by introducing a cleaning gas into the chamber r.f. environment for plasma etching. The invention avoids the need to disassemble the deposition apparatus, approximately 16-24 hours each time a reaction tube is changed. Also, by utilizing an r.f. electrode within the quartz tube, shielded by the metal thermal cover, the system is inherently safe and easier to use than prior art microwave systems.

This invention will be described in greater detail by referring to the drawing and the description of the preferred embodiment that follows.

BRIEF DESCRIPTION OF THE DRAWING

The sole FIGURE in this application is a schematic view showing the plasma etch cleaning configuration for use in a low pressure chemical vapor deposition system.

DESCRIPTION OF THE PREFERRED EMBODIMENT

Referring now to the sole FIGURE in this application, a preferred embodiment of this invention is depicted. Low pressure chemical vapor deposition equipment (LP/CVD) conventionally employs a quartz reaction tube 10 having annular heater 12. A metal thermal cover 14 is disposed about the heater. In its primary application for LP/CVD, this system employs an outlet conduit 16 having therein a throttle valve 18 to control the process of pressure. A vacuum pump not shown in downstream of the throttle valve 18. The system also employs a pressure measurement system to control process parameters during both LP/CVD and during plasma cleaning operations.

Gas from a supply is introduced via conduit 22 through port 24 into the reaction chamber 10. Although not shown, the gas supply conduit 22 was used to supply alternatively either the reaction gas for LP/CVD or, a cleaning gas into the chamber environment.

This commercially available system is modified for plasma etch cleaning by the introduction of an r.f. electrode 26 which is disposed co-axially within the quartz tube 10. The electrode 26 is held in place by means of isolators 28 and 30. The end of tube 10 is sealed by means of end seal 32 which is integral part of the isolator 30.

The r.f. system includes a match box and an r.f. generator 34 providing a power to the electrode 26. Preferably, the electrode 26 forms the r.f. anode while the metal thermal cover 14 performs the cathode which, as shown in the figure, is grounded. The cover 14 performs dual roles; it as shown encloses the chamber 10 as a thermal shield. Additionally, it completely shields the r.f. electrode 26, preventing escape of r.f. powerwaves from the tube since it acts as the ground path.

Once a production run has been completed and it is desired to clean the chamber 10, the semiconductor devices being worked on and any supports therein are removed from the tube 10. The tube, however, still remains an integral part of the system coupled to conduit 16 and the various heating elements. That is, the tube is not physically disassembled. The r.f. electrode assembly comprising the electrode 26 with the respective isolators 28 and 30 is then inserted into the open end of the tube 10 with the end sealed by means of a vacuum seal member 32. The seal may be integral with the electrode or a separate component. A suitable cleaning gas such as P.D. 100 or other suitable gas is introduced via a conduit 22. Excitation by the r.f. power in the chamber initiates a cleaning plasma which etch cleans any formations on the walls. When the cleaning operation is complete, any gaseous residue is easily removed from the inside of the chamber by the vacuum pump. The r.f. coil and the isolators are then removed. The technique, therefore, utilizes a system for cleaning without incurring any significant down time or disassembly.

EXAMPLE

For a low pressure C.V.D. system, typical operating parameters are:
R.F. Power—1–2 kw
Etching Gas Flow—1–2 liters/min
Pressure—0.2–0.5 torr
Etch Rate—≅800 A/min A modification of this system could eliminate the r.f. electrode as an insertable element into the chamber. That is, the heater 12 can be built to be used as an r.f. coil as well as a heater. This would be accomplished by weaving an R.F. coil between the resistance heater elements but electrically isolating them. Insulating and dielectric material would be woven between the R.F. coil and heater elements. Thus, etch cleaning could be accomplished by activating the r.f. coil without the requirement that the electrode be inserted into the tube. Such a modification further simplifies the system.

While this invention has been described relative to low pressure chemical vapor depositions systems, it may be employed in other devices wherein chemical vapor deposition results in residue caused by deposition products building up on the walls of the reaction chambers. For example, the invention can be used as a parts cleaner rather than wet etching the hardware. An example of a part is a quartz boat holding wafers during processing.

We claim:

1. A method of removing deposition products from the interior of a chemical vapor deposition chamber comprising the steps of:
    removing a device processed in said chamber and providing a pair of r.f. electrodes relative to said chamber;
    mounting one of said electrodes into said chamber following removal of the device processed and sealing said chamber;
    supplying a cleaning gas into said chamber, and
    supplying r.f. electrical power between said pair of electrodes to establish an r.f. plasma of the cleaning gas within said chamber to clean by plasma etching deposition products from the interior of said chamber.

2. The method of claim 1 further comprising the steps of evacuating said chamber prior to the introduction of cleaning gas and again evacuating said chamber following plasma etching.

3. The method of claim 1 wherein a first of said electrodes is configured to be mounted externally of said chamber and the second of said electrodes is mounted coaxially with respect to the chamber.

4. The method of claim 3 wherein an annular heating element is disposed outside said chamber and a metallic thermal shield covering said heating element comprises said first electrode.

5. The method of claim 3 wherein a first r.f. isolator is positioned at one end of said second electrode and a second r.f. isolator is positioned at the other end of said second electrode.

6. The method of claim 1 wherein a vacuum pump coupled to one end of said chamber opposite a location where said cleaning gas is supplied into said chamber.

* * * * *